United States Patent
Fisher-Jeffes

(10) Patent No.: US 7,051,266 B2
(45) Date of Patent: May 23, 2006

(54) METHODS OF, AND APPARATUS FOR, ENCODING A BIT-STREAM

(75) Inventor: Timothy Fisher-Jeffes, Cambridge (GB)

(73) Assignee: Ubinetics Limited, Melbourn (GB)

( * ) Notice: Subject to any disclaimer, the term of this patent is extended or adjusted under 35 U.S.C. 154(b) by 320 days.

(21) Appl. No.: 10/469,749

(22) PCT Filed: Feb. 28, 2002

(86) PCT No.: PCT/GB02/00871

§ 371 (c)(1),
(2), (4) Date: Sep. 4, 2003

(87) PCT Pub. No.: WO02/071624

PCT Pub. Date: Sep. 12, 2002

(65) Prior Publication Data

US 2004/0083416 A1    Apr. 29, 2004

(30) Foreign Application Priority Data

Mar. 6, 2001 (GB) ................................ 0105526.8

(51) Int. Cl.
*H03M 13/00* (2006.01)

(52) U.S. Cl. .................................................... 714/776

(58) Field of Classification Search ................. 714/776
See application file for complete search history.

(56) References Cited

U.S. PATENT DOCUMENTS

| 4,055,832 | A | * | 10/1977 | En ............................. 714/793 |
| 5,381,425 | A |   | 1/1995  | Bitzer et al. |
| 5,511,082 | A | * | 4/1996  | How et al. ................... 714/790 |
| 5,960,040 | A | * | 9/1999  | Cai et al. ..................... 375/279 |
| 6,182,260 | B1 | * | 1/2001 | Kang et al. ................. 714/755 |
| 6,871,303 | B1 | * | 3/2005 | Kawahara et al. .......... 714/702 |

FOREIGN PATENT DOCUMENTS

| EP | 0986182 | 9/1999 |
| GB | 2361608 | 11/2000 |

OTHER PUBLICATIONS

Diffie, et al., "Privacy and Authenication: An Introduction to Crytography", Proceedings of the IEEE, vol. 67, No. 3, Mar. 1979, pp. 1-30.

* cited by examiner

*Primary Examiner*—Shelly Chase
(74) *Attorney, Agent, or Firm*—Banner & Witcoff, Ltd.

(57) ABSTRACT

A stream of recursive systematic convolutional codes $P_n$ is generated by XORing each bit of an input bit stream $I_n$ with a predetermined bit of the content of a cyclic shift element (22). The content of the shift element (22) is updated by adder (24) under the control of the input bit stream $I_n$.

9 Claims, 1 Drawing Sheet

US 7,051,266 B2

METHODS OF, AND APPARATUS FOR, ENCODING A BIT-STREAM

The invention relates to encoding bit streams. In particular, the invention relates to encoding a bit stream to generate error checking information which can be transmitted along side the bit stream. Such error checking information enables transmission errors in the bit stream to be corrected at its destination.

Figure 1:
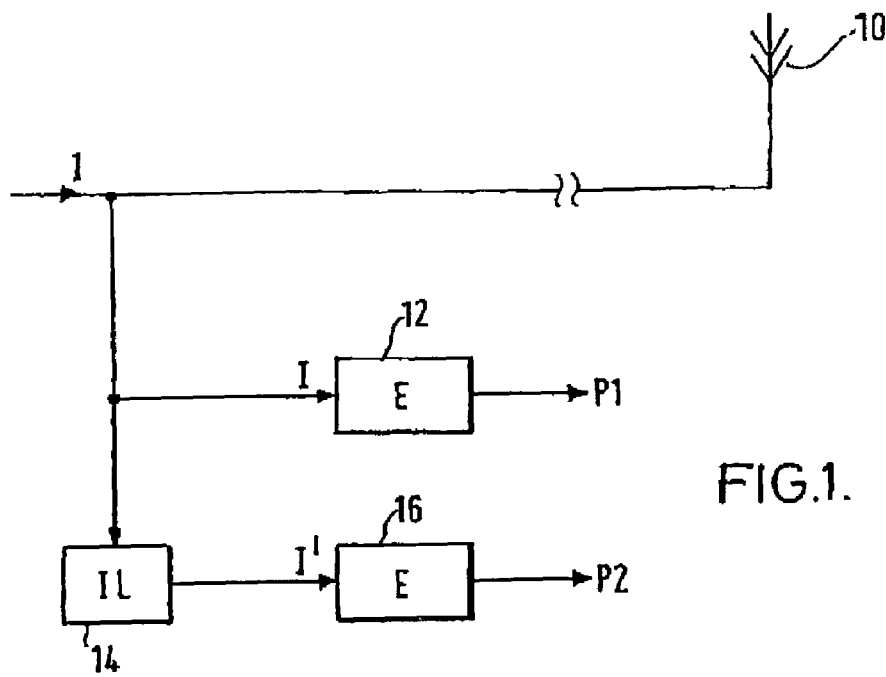

FIG. 1 is a block diagram of a part of a turbo encoder in a UMTS transmitter. A bit stream I, representing information to be transmitted, is supplied, ultimately, to an antenna 10 for transmission, but is also used to generate two streams of parity information P1 and P2. The parity information streams P1 and P2 are used to produce error checking information which is transmitted with the bit stream I. To generate the parity stream P1, the bit stream I is supplied to a RSC (recursive systematic convolutional) component encoder 12 which, in response, outputs parity stream P1. To produce parity stream P2, the bit stream I is supplied to an interleaver 14 which outputs an interleaved bit stream I'. The interleaved bit stream I' is supplied to a second RSC component encoder 16 which, in response, outputs parity stream P2. The RSC component encoders 12 and 16 have the same constitution and operate on their input bit streams in the same manner.

One aim of the invention is to provide an efficient way of encoding signals such as can be used within, for example, a turbo encoder.

The invention consists in a method of encoding a bit stream, the method comprising encoding each stream bit by XORing it with a bit from a predetermined position within a first M-sequence and updating the first M-sequence between encoding successive stream bits.

The invention also consists in encoding apparatus for encoding a bit stream, the apparatus comprising encoding means arranged to produce an encoding bit for each stream bit by XORing each stream bit with a bit from a predetermined position within a first M-sequence and updating means arranged to update the first M-sequence between encoding successive stream bits.

Hence, the invention provides an efficient way of encoding bit streams into a format suitable for use in a turbo encoder.

As is well known, a binary word can be cyclically shifted by transferring a number of bits from one end of the word to the other end. In the context of the invention, an M-sequence is a binary word which has the property that if it is combined using modulo 2 addition with a version of itself that has been cyclically shifted by a first amount, then the result is a version of the original M-sequence that has been cyclically shifted by a second amount. The word 0111001 is an example of an M-sequence. If this word is combined using modulo 2 addition with 1100101 (which is a version of the original M-sequence with two bits cycled from its left end to its right end) then the result is 1011100 (which is a version of the original M-sequence with 6 bits transferred from its left end to its right end). It will be apparent that a string of zeros is also an M-sequence according to the above definition.

In one embodiment, the first M-sequence is updated between encoding successive bits of the stream by rotating the first M-sequence and then, subject to the level of the later of the two successive stream bits between which the updating occurs, adding a second M-sequence into the first M-sequence. The rotation of the first M-sequence preferably comprises transferring a number of bits from one end of the first M-sequence to the other. In one implementation, the second M-sequence is the impulse response of an encoder, for example a RSC component encoder.

In one embodiment, the invention is used to generate a first stream of error checking information by encoding a bit stream destined for transmission, and also to generate a second stream of error checking information by encoding an interleaved version of the bit stream that is destined for transmission.

The invention also extends to a program for causing data processing apparatus to perform the encoding process of the invention. The invention also consists in a computer readable data carrier bearing such a program.

Figure 2:
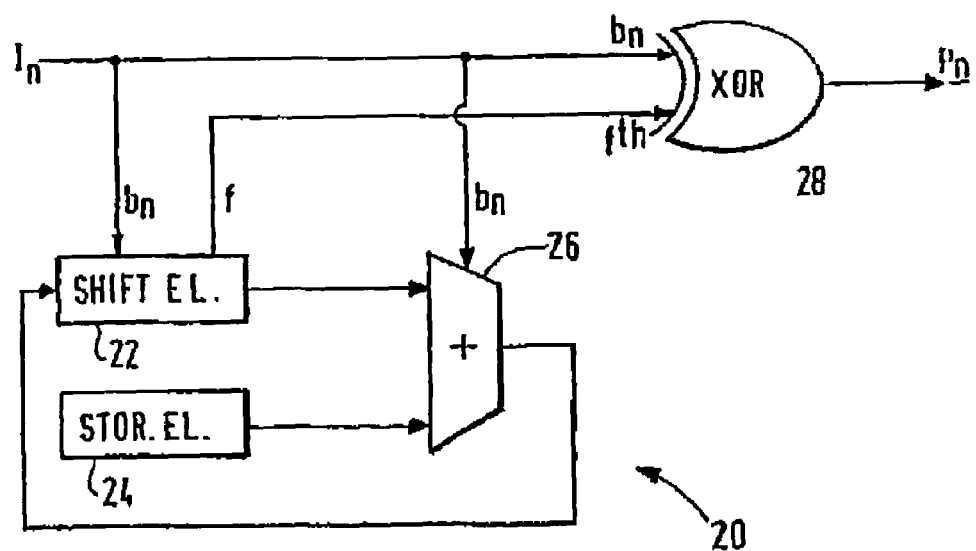

By way of example only, an embodiment of the invention will now be described with reference to the accompanying figures, in which:

FIG. 1 is a block diagram of part of a turbo encoder according to the prior art; and FIG. 2 is a block diagram of a RSC component encoder according to the invention.

The RSC component encoder 20 of FIG. 2 acts on an input bit stream $I_n$ to produce a stream of parity information $P_n$. The RSC component encoder 20 could be used as encoder 12 or 16 of FIG. 1 with, as appropriate, $I_n$ being I or I' and $P_n$ being P1 or P2.

Encoder 20 comprises a shift element 22, a storage element 24, an adder 26 and an XOR gate 28.

Shift element 22 is capable of storing a binary word and is capable of being triggered to transfer the left-most bit of the word that it contains to the right hand end of the word. The shift element 22 is triggered to perform this cyclical shift operation by the input bit stream $I_n$. The shift element 22 and a storage element 24 each provide their contents as inputs to adder 26. Adder 26 performs modulo 2 addition of its inputs subject to a control signal in the form of the input bit stream $I_n$. Adder 26 can be regarded as performing a bitwise XOR operation on its input words. The result provided by adder 26 is stored into shift element 22. The XOR gate 28 performs an exclusive OR operation on the input bit stream $I_n$ and a predetermined bit of shift element 22. The predetermined bit is the bit at position f within the shift element, whose bits are numbered from its left hand end, commencing with position zero. The output of XOR gate 28 is the parity stream $P_n$.

In operation, the encoder 20 manipulates an M-sequence to produce the parity stream $P_n$. The nature of the M-sequence used will now be discussed.

Given an impulse input stream of $I_n=1, 0, 0, 0, \ldots$, the output of a RSC encoder with a constraint length of K shall be a repeating sequence of length $2^{k-1}-1$ given by $O_n=1\oplus h(0), h(1), \ldots, h(2^{k-1}-2), h(0), h(1), \ldots$. In mathematical terms, the output generated from such an input is given by $O_n=H(k)\oplus I_n$, where the $\oplus$ operator represents a modulo-2 convolution. The first output bit $O_n(0)$ of $1\oplus h(0)$ comes about from the fact that the input has a direct influence on the output, making it non-strictly causal. The sequence $h(0), h(1), \ldots h(2^{k-1}-2)$ that is repeated is an M-sequence and shall henceforth be referred to as the impulse response word. Thus, in the embodiment shown in FIG. 2, the M-sequence used in encoder 20 is the impulse response word of a RSC encoder.

At initialization, shift element 22 is filled with zeros and the impulse response word is put in the storage element 24, positioned so that its earliest (in terms of time) bit, which would be h(0) in the above example, is located at bit position f of element 24. The succeeding bits of the impulse response word are stored at positions f+1, f+2, etc., until the end of element 24 is reached, whereupon the remaining bits of the impulse response word are wrapped around to the beginning of element 24 and stored in sequence by placing the earliest remaining bit of the impulse response word at position zero of element 24 and the latest bit of the impulse response word at position f−1.

When a bit $b_n$ of the bit stream $I_n$ arrives at the encoder 20 it triggers the shift element 22 to rotate the M-sequence that it contains by transferring one bit from the left end of the M-sequence to the right end of the M-sequence. The content of shift element 22 is then output to provide an input to adder 26. Adder 26 then operates under the control of bit $b_n$. If $b_n$ is level 1, then adder 26 performs modulo 2 addition of its inputs, the words stored in elements 22 and 24. The content of shift element 22 is then updated with the output of adder 26. If $b_n$ is level 0, then adder 26 does not operate and the content of shift element 22 is not updated.

XOR gate 28 then operates on the bit $b_n$ of the input bit stream $I_n$ and the bit f of shift element 22, whose content may have been updated by the adder 26 (depending on the level of $b_n$). The resulting output of XOR gate 28 is the parity bit of parity stream $P_n$ for bit $b_n$ of input bit stream $I_n$. When bit $b_{n+1}$ of input bit stream $I_n$ arrives at encoder 20, the operations of the shift element 22, the storage element 24, the adder 26 and the XOR gate 28 are repeated in order to generate the next bit of the parity stream $P_n$. It is within the capabilities of a person skilled in this art to arrange the timing of the operation of the components of encoder 20 to generate parity stream $P_n$, but, nevertheless, the timing of the operations performed by the encoder 20 will be apparent from the following pseudo-code listing which represents a software implementation of the encoder 20 which could be run on a digital signal processor (DSP):

```
1)  initialise x = 0
2)  loop for all i
3)      ROTATE x LEFT by 1
4)      if(i = = 1)
5)          x = x BIT WISE XOR m
6)      end if
7)      o = iXOR x(f)
8)  end loop
```

Wherein:

x represents the content of shift element 22 and is an M-sequence whose bits are indexed from its left-hand end, beginning with bit 0.

i denotes the input bit stream $I_n$, which comprises input bits $b_{n-1}$, $b_n$, $b_{n+1}$, etc. Lines 2 and 8 of the listing demarcate a loop which is performed for each of the input bits arriving at the encoder 20.

Line 3 is the cyclic single-bit shift performed by shift element 22 upon arrival of each bit of stream $I_n$. The bits in x are shifted to the left by one bit and the displaced left-most bit is appended to the right-hand end of x.

Lines 4, 5 and 6 indicate the conditional, modulo 2 addition performed by adder 26. The constant m is the content of storage element 24. Bit f of m is the first bit of the impulse response word of the RSC encoder and bit f−1 of m is the last bit of the impulse response word.

Variable o indicates the output parity stream $P_n$ created by performing the exclusive OR function on the input stream bit and the bit f of x. The value f is a constant which can conveniently be set to 0, both in the pseudo code listing and the circuit of FIG. 2.

The invention claimed is:

1. A method of encoding a bit stream, the method comprising encoding each stream bit by XORing each stream bit with a bit from a predetermined position within a first M-sequence and updating the first M-sequence between encoding successive stream bits;
   wherein updating the first M-sequence comprises rotating the first M-sequence and then, subject to a level of the later of the two successive stream bits between which the updating occurs, adding a second M-sequence into the first M-sequence.

2. A method according to claim 1, wherein rotating the first M-sequence comprises transferring a number of bits from one end of the first M-sequence to the other.

3. A method according to claim 1, wherein the second M-sequence comprises an impulse response word or a rotated version thereof.

4. A method of producing error checking information for a bit stream destined for transmission, the method comprising:
   generating a first stream of error checking information by encoding each bit of the stream by XORing each bit of the stream with a bit from a predetemined position within a first M-sequence and updating the first M-sequence between encoding successive bits of the stream,
   interleaving the bit stream, and
   generating a second stream of error checking information by encoding each bit of the interleaved stream by XORing each bit of the interleaved stream with a bit from a predetermined position within a second M-sequence and updating the second M-sequence between encoding successive bits of the interleaved stream.

5. A computer-readable medium containing computer-executable instructions for causing a data processing apparatus to perform a method of encoding a bit stream, the method comprising: encoding each stream bit by XORing each stream bit with a bit from a predetermined position within a first M-sequence and updating the first M-sequence between encoding successive stream bits;
   wherein updating the first M-sequence comprises rotating the first M-sequence and then subject to a level of the later of the two successive stream bits between which the updating occurs, adding a second M-sequence into the first M-sequence.

6. An encoding apparatus for encoding a bit stream the apparatus comprising an encoder arranged to produce an encoded bit for each stream bit by XORing each stream bit with a bit from predetermined position within a first M-sequence and an updater arranged to update the first M-sequence between encoding successive stream bits,
   wherein the updater comprises a rotator for rotating the first M-sequence and an adder for adding, subject to a level of the later of the two successive stream bits between which the updating occurs, a second M-sequence into the first M-sequence alter rotation.

7. The encoding apparatus according to claim 6, wherein the rotator is arranged to rotate the first M-sequence by transferring a number of bits from one end of the first M-sequence to the other.

8. The encoding apparatus according to claim 6, wherein the second M-sequence is an impulse response word or a rotated version thereof.

9. An encoder for producing error checking information for a bit stream destined for transmission, the encoder comprising:
   a first encoding apparatus arranged to operate on the bit stream to produce first stream of error checking information, the first encoding apparatus comprising a first encoder ranged to produce an encoded bit for each bit of the stream by XORing each bit of the stream with a bit from a predetermined position within a first M-sequence and a first updater arranged to update the first M-sequence between encoding successive stream bits, an interleaver arranged to interleave the bit stream into an interleaved bit stream, and a second encoding apparatus arranged to operate an the interleaved bit stream to produce a second stream of error checking information, the second encoding apparatus comprising a second encoder arranged to produce an encoded bit for each bit of the interleaved stream by XORing each bit of the interleaved stream with a bit from a predetermined position within a second M-sequence and a second updater arranged to update the second M-sequence between encoding successive bits of the interleaved stream.

* * * * *